(12) United States Patent
Kim et al.

(10) Patent No.: US 12,207,554 B2
(45) Date of Patent: Jan. 21, 2025

(54) THERMOELECTRIC MATERIAL, AND THERMOELECTRIC ELEMENT AND DEVICE INCLUDING SAME

(71) Applicants: Samsung Electronics Co., Ltd., Suwon-si (KR); Imperial College Innovations Limited, London (GB)

(72) Inventors: Yongchul Kim, Seoul (KR); Aron Walsh, London (GB)

(73) Assignees: Samsung Electronics Co., Ltd., Gyeonggi-do (KR); Imperial College Innovations Limited, London (GB)

( * ) Notice: Subject to any disclaimer, the term of this patent is extended or adjusted under 35 U.S.C. 154(b) by 0 days.

(21) Appl. No.: 17/570,902

(22) Filed: Jan. 7, 2022

(65) Prior Publication Data

US 2022/0238776 A1 Jul. 28, 2022

(30) Foreign Application Priority Data

Jan. 28, 2021 (KR) .................. 10-2021-0012633

(51) Int. Cl.
*H10N 10/854* (2023.01)
*H10N 10/13* (2023.01)

(52) U.S. Cl.
CPC .......... *H10N 10/854* (2023.02); *H10N 10/13* (2023.02)

(58) Field of Classification Search
CPC ....... H10N 10/85; H10N 10/854; H10N 10/13
See application file for complete search history.

(56) References Cited

U.S. PATENT DOCUMENTS

| | | | |
|---|---|---|---|
| 9,091,768 B2 | 7/2015 | Kobayashi et al. | |
| 2005/0081906 A1 | 4/2005 | Adachi et al. | |
| 2005/0178424 A1 | 8/2005 | Yotsuhashi et al. | |
| 2010/0132755 A1 | 6/2010 | Uchida et al. | |
| 2010/0175734 A1* | 7/2010 | Lee .................. | B82Y 40/00 977/773 |
| 2015/0148216 A1 | 5/2015 | Nazarpoor et al. | |
| 2019/0122828 A1 | 4/2019 | Seo et al. | |
| 2021/0043854 A1* | 2/2021 | Wheeler ............ | H10K 85/30 |

(Continued)

FOREIGN PATENT DOCUMENTS

| | | |
|---|---|---|
| CN | 111778017 | 10/2020 |
| JP | 6000664 B2 | 10/2016 |
| KR | 10-1925765 B1 | 12/2018 |

OTHER PUBLICATIONS

Lucy D. Whalley, et al., "Phonon anharmonicity, lifetimes, and thermal transport in CH3NH3PbI3 from many-body perturbation theory," Physical Review B 94, 220301, Dec. 8, 2016.

(Continued)

*Primary Examiner* — Bethany L Martin
(74) *Attorney, Agent, or Firm* — Harness, Dickey & Pierce, P.L.C.

(57) ABSTRACT

Provided are a thermoelectric material, and a thermoelectric element and a thermoelectric module, each including the thermoelectric material. The thermoelectric material, according to some embodiments includes an n-doped metal halide compound having a zero-dimensional (0D) electronic system. The thermoelectric material has a significantly low electrical thermal conductivity and improved electron conductivity and thus may enhance thermoelectrical performance.

10 Claims, 10 Drawing Sheets

(56) References Cited

U.S. PATENT DOCUMENTS

2021/0115329 A1* 4/2021 Saparov ............... H01L 33/502

OTHER PUBLICATIONS

Xiang Long et al., "Solvent-free synthesis of organometallic halides CH3NH3Pbl3 and (CH3NH3)3Bi2l9 and their thermoelectric transport properties," Applied Physics Letters, 115, 072104, Aug. 13, 2019.

Taehwan Jun, et al., "Lead-Free Highly Efficient Blue-Emitting Cs3Cu2l5 with 0D Electronic Structure," Advanced Materials 2018, 30, 1804547, Sep. 14, 2018.

Request for the submission of an Opinion issued Nov. 22, 2024 in Korean Application No. 10-2021-0012633.

Md Azimul Haque et al., 'Halide Perovskites: Thermal Transport and Prospects for Thermoelectricity', Advanced Science, 7(2020) 1903389, Apr. 16, 2020.

\* cited by examiner

THERMOELECTRIC MATERIAL, AND THERMOELECTRIC ELEMENT AND DEVICE INCLUDING SAME

CROSS-REFERENCE TO RELATED APPLICATION

This application is based on and claims priority under 35 U.S.C. § 119 to Korean Patent Application No. 10-2021-0012633, filed on Jan. 28, 2021, in the Korean Intellectual Property Office, the disclosure of which is incorporated herein in its entirety by reference.

BACKGROUND

1. Field

The present disclosure relates to a thermoelectric material, and a thermoelectric element and a thermoelectric device, each including the thermoelectric material.

2. Description of the Related Art

A thermoelectric material may be a material that exhibits a thermoelectric phenomenon. The thermoelectric phenomenon is a reversible, direct energy conversion from heat to electricity and vice versa, which occurs due to movement of charge carriers (e.g., electrons and/or holes) in the thermoelectric material. Thermoelectric phenomena may include, for example, the Peltier effect, in which two dissimilar materials are connected at junction points and heat is released or absorbed at the junction points of the dissimilar materials due to a current applied from the outside, the Seebeck effect, in which an electromotive force is generated due to a temperature difference between the ends of the dissimilar materials that are connected at junction points, and/or the Thomson effect, in which heat is released or absorbed when an electric current is applied to a material having a temperature gradient.

Currently, thermoelectric materials are used in active cooling systems of semiconductor equipment and electronic devices in which heating issues cannot be easily addressed by a passive and/or compression cooling system. In addition, there has been increasing demand for thermoelectric materials in areas such as precision temperature control systems (e.g., in DNA applications) where conventional systems (e.g. systems reliant on refrigerant gas compression) have been proven to be ineffective and/or impractical. Cooling systems using thermoelectric materials may be referred to as thermoelectric cooling.

Thermoelectric cooling may be an environmentally friendly vibration-free low-noise cooling technique that does not use a refrigerant gas (which may cause environmental problems), and, if highly efficient thermoelectric cooling materials are developed and improve cooling efficiency, such materials could have a wide range of applications including in general cooling systems such as refrigerators and air conditioners. In addition, thermoelectric materials have been attracting attention as a renewable and/or recapture energy source, since thermoelectric materials can be applied to a vehicle engine and/or in industrial plants to enable the generation of electrical energy from a temperature difference between ends of the material. Such a thermoelectric power generation system is already in use in space probes on Mars, Saturn, etc. where the use of solar energy is unavailable and/or ineffective. Such a thermoelectric power generation system could also be used as a power source for flexible/wearable devices in the future.

As a factor for measuring performance of such thermoelectric materials, a ZT value in Equation 1, commonly known as a dimensionless figure of merit, is used.

$$ZT=(S^2 \sigma T)/k \qquad \text{<Equation 1>}$$

In Equation 1, ZT represents the thermoelectric material's figure of merit, S represents a Seebeck coefficient, G represents electrical conductivity, T represents absolute temperature, and K represents thermal conductivity.

As represented by Equation 1, to increase the ZT value of a thermoelectric material, it is necessary to find a material that has a high Seebeck coefficient, high electrical conductivity, and/or low thermal conductivity.

SUMMARY

Provided is a thermoelectric material exhibiting improved thermoelectric performance.

Provided is a thermoelectric element including the thermoelectric material.

Provided is a thermoelectric module including the thermoelectric element.

Additional aspects will be set forth in part in the description which follows and, in part, will be apparent from the description, or may be learned by practice of the presented embodiments of the disclosure.

According to an aspect, there is provided a thermoelectric material including an n-doped metal halide compound. The metal halide compound includes a 0D (zero-dimensional) electronic system.

According to another aspect, there is provided a thermoelectric device including the thermoelectric material.

According to another aspect, there is provided a thermoelectric module including the thermoelectric element.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
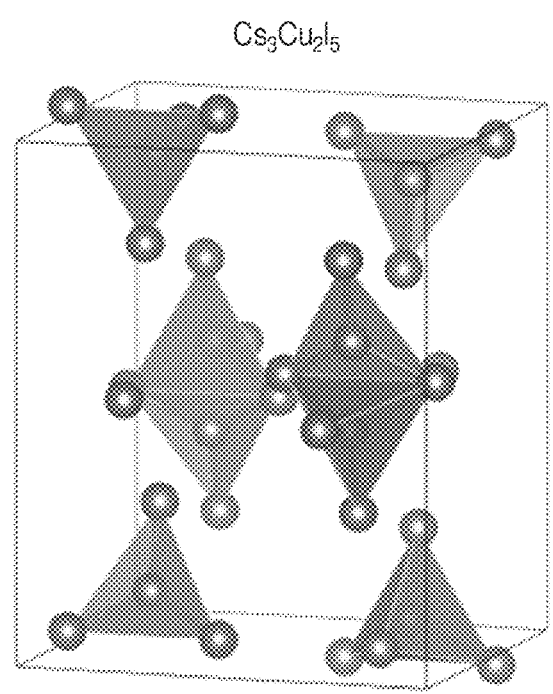
FIG. 1 shows a crystal structure of $Cs_3Cu_2I_5$ as an example of a metal halide compound having a zero-dimensional (0D) electronic system in a thermoelectric material according to an example embodiment.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The present inventive concepts, which will be described more fully hereinafter, may have various variations and various embodiments, and specific embodiments will be shown the accompanied drawings and described in greater details. However, the inventive concepts should not be construed as limited to specific embodiments set forth herein. Rather, these embodiments are to be understood as encompassing all variations, equivalents, or alternatives included in the scope of this inventive concept.

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. As used herein, the terms "comprises" and/or "comprising," or "includes" and/or "including" when used in this specification, specify the presence of stated features, regions, integers, steps, operations, elements, components, ingredients, materials, and/or combinations thereof; but do not preclude the presence and/or addition of one or more other features, regions, integers, steps, operations, elements, components, ingredients, materials, and/or combinations thereof.

When the terms "about" or "substantially" are used in this specification in connection with a numerical value, it is intended that the associated numerical value includes a manufacturing tolerance (e.g., ±10%) around the stated numerical value.

In the drawings, the thicknesses of layers and regions may be exaggerated for clarity and/or convenience of description. When it is described that a certain component, such as a layer, a film, a region, or a plate, is "above" or "on" another component, the certain component may be directly above another component or a third component may be interposed therebetween. Although the terms "first," "second," etc. may be used herein to describe various elements, these elements should not be limited by these terms. These terms are only used to distinguish one element from another element. For example, it will be understood that, although the terms "first," "second," etc. may be used herein to describe various elements, components, regions, layers, and/or sections, these elements, components, regions, layers, and/or sections should not be limited by these terms.

In addition, the steps described herein may be carried out in any suitable order. For example, when a first step and a second step are described, it will be understood that the first step does not necessarily be performed prior to the second step.

Herein, a thermoelectric material, and a thermoelectric element and a thermoelectric module, each employing the thermoelectric material according to some example embodiments are described in greater details.

A thermoelectric material, according to some embodiments, includes a metal halide compound that has a zero-dimensional (0D) electronic system and is in an n-doped state. The term 0D may be in contrast to, e.g., a one-dimensional (1D) electronic system (e.g., carbon nanotubes and/or a nanowire), a two-dimensional electronic system (e.g., a topological material, graphene, and/or $MoS_2$) and/or a three-dimensional (3D) electronic system, wherein each describe, for example, the degrees of freedom for a charge carrier (e.g., an electron). For example, in a 0D electronic system an electron may experience quantum confinement in three spatial dimensions.

Performance of the thermoelectric material uses a ZT value, which is commonly referred to as a dimensionless figure of merit, as defined by Equation 1.

$$ZT=(S^2 \sigma T)/k \qquad \text{<Equation 1>}$$

In Equation 1, ZT represents a figure of merit of the thermoelectric material, S represents a Seebeck coefficient, G represents electrical conductivity, T represents absolute temperature, and K represents thermal conductivity.

As represented by Equation 1, to increase the ZT value of a thermoelectric material, the Seebeck coefficient and/or the electrical conductivity need to be increased, while the thermal conductivity needs to be decreased. However, in general, when an electrical conductivity increases, the thermal conductivity contributed by electrons also increases, and thus, the thermal conductivity also increases at the same time. Therefore, merely increasing the electrical conductivity is ineffective in improving the figure of merit.

In this context, provided is a thermoelectric material that has improved thermoelectric performance by increasing electrical conductivity via n-doping using a metal halide compound having a 0D electronic system that exhibits a low thermoelectric conductivity.

FIG. 1 shows the crystal structure of $Cs_3Cu_2I_5$ as an example of a metal halide compound having the 0D electronic system in a thermoelectric material according to an example embodiment. As shown in FIG. 1, the metal halide compound has the 0D electronic system where $[Cu_2I_5]^{3-}$ clusters exist independently from each other, without sharing an element and/or being connected to each other.

Figure 2:
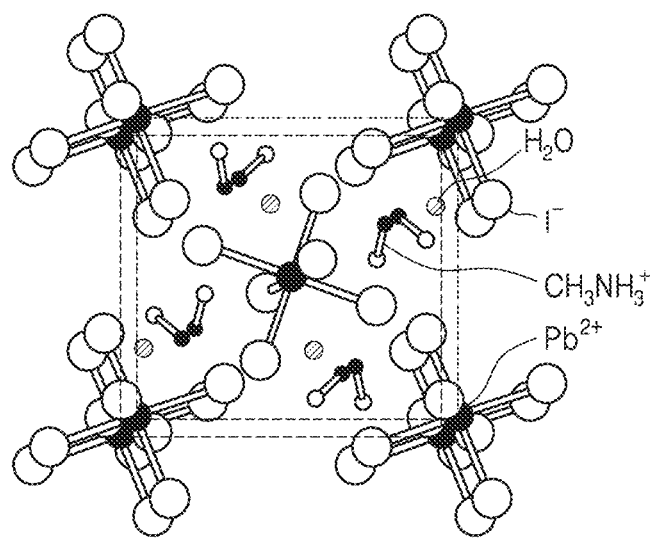
FIG. 2 shows a crystal structure of $(MA)_4PbI_6$ as an example of a metal halide compound having a 0D electronic system in a thermoelectric material according to an example embodiment.

FIG. 2 shows the crystal structure of $(MA)_4PbI_6$ as an example of a metal halide compound having the 0D electronic system in a thermoelectric material according to another example embodiment. Here, MA refers to a methylammonium ion ($CH_3NH_3^+$). As shown in FIG. 2, the metal halide compound also has the 0D electronic system where $[PbI_6]^{2-}$ clusters exist independently from each other.

Such metal halide compounds, having the 0D electronic system, have a significantly low thermal conductivity and thus may improve thermoelectric performance. Further, such metal halide compounds are capable of inducing improvement in the Seebeck coefficient by causing an increase in density-of-states (DOS) at the Fermi energy level due to the 0D confinement.

In some embodiments, the electrical conductivity of materials including such metal halide compounds having the 0D electronic system (since the metal halide compounds having the 0D electronic system often have p-type characteristics) may be increased via n-doping, and the materials may be applied as a thermoelectric material according to some embodiments. The method for n-doping, although not particularly limited, may include, for example, a method of creating vacancy in the metal halide compound, and/or a method of doping with at least one dissimilar element.

According to some embodiments, such 0D metal halide compounds may include one or more compounds represented by Formulas 1 to 3.

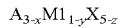  <Formula 1>

In Formula 1, A may be a monovalent cation, M1 may be a divalent transition metal, X may be a halogen, $0 \leq x \leq 0.5$, $0 \leq y \leq 0.5$, and $0 \leq z \leq 0.5$, wherein at least one of x, y, and z may be greater than 0. For example, A may be at least one of an alkali metal cation, a free ammonium ion, an amidinium-group ion, a combination of a free ammonium ion and an amidinium-group ion, and/or a combination thereof.

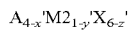  <Formula 2>

In Formula 2, A may be a monovalent cation, M2 may be a divalent transition metal ion, X may be a halogen, $0 \leq x' \leq 0.5$, $0 \leq y' \leq 0.5$, and $0 \leq z' \leq 0.5$, wherein at least one of x', y', and z' may be greater than zero (0). For example, A may be at least one of an alkali metal cation, a free ammonium ion, an amidinium-group ion, a combination of a free ammonium ion and an amidinium-group ion, and/or a combination thereof.

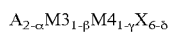  <Formula 3>

In Formula 3, A may be a monovalent cation, M3 may be a monovalent transition metal ion, M4 may be a trivalent metal ion, X may be a halogen, $0 \leq \alpha \leq 0.5$, $0 \leq \beta \leq 0.5$, $0 \leq \gamma \leq 0.5$, and $0 \leq \delta \leq 0.5$, wherein at least one of $\alpha$, $\beta$, $\gamma$, and $\delta$ may be greater than 0. For example, A may be at least one of an alkali metal cation, a free ammonium ion, an amidinium-group ion, a combination of a free ammonium ion and an amidinium-group ion, and/or a combination thereof.

According to some embodiments, in Formulas 1 to 3, A may be a monovalent alkali metal cation and may include one or more of $Cs^+$, $Rb^+$, $K^+$, and/or $Na^+$. For example, in Formula 1, A may be $Cs^+$.

According to some embodiments, in Formulas 1 to 3, A may be a free ammonium ion and may include at least one represented by Formulas 4 and 5.

  <Formula 4>

In Formula 4, $R_1$ may be a C1-C24 alkyl group, a C3-C20 cycloalkyl group, or a C6-C20 aryl group.

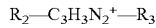  <Formula 5>

In Formula 5, $R_2$ may be a C1-C24 alkyl group, a C3-C20 cycloalkyl group, or a C6-C20 aryl group, and $R_3$ may be a hydrogen atom or a C1-C24 alkyl group.

In some embodiments, in Formula 4, $R_1$ may be a C1-C24 alkyl group. For example, $R_1$ may be a C1-C7 alkyl group (e.g., a methyl group). In some embodiments, in Formula 5, $R_2$ may be a C1-C24 alkyl group, and/or $R_3$ may be a hydrogen atom or a C1-C24 alkyl group. For example, $R_2$ may be a C1-C7 alkyl group (e.g., a methyl group), and/or $R_3$ may be a hydrogen atom or a C1-C7 alkyl group (e.g., $R_3$ may be a hydrogen atom).

According to some embodiments, in Formulas 1 to 3, A may be an amidinium-group ion and may include a structure represented by Formula 6.

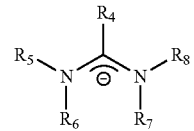  <Formula 6>

In Formula 6, $R_4$ to $R_8$ may each independently be a hydrogen atom, a C1-C24 alkyl group, a C3-C20 cycloalkyl group, and/or a C6-C20 aryl group.

In some embodiments, in Formula 6, $R_4$ to $R_8$ may be each independently a hydrogen atom, an amino group, and/or a C1-C24 alkyl group. For example, $R_4$ to $R_8$ may be each independently may be a hydrogen atom, an amino group, and/or a C1-C7 alkyl group (e.g., $R_4$ to $R_8$ may be each independently may be a hydrogen atom, an amino group, or a methyl group). For example, in some embodiments, $R_4$ may be a hydrogen atom, an amino group, or a methyl group, and $R_5$ to $R_8$ may each be hydrogen atoms. For example, in some embodiments wherein A represents the amidinium-group, A may include a formamidinium ion ($NH_2CH=NH_2^+$), an acetamidinium ion ($NH_2C(CH_3)=NH_2^+$), a guamidinium ion ($NH_2C(NH_2)=NH_2^+$), and/or the like.

According to some embodiments, in Formulas 1 and 2, M1 and M2 may each independently be a divalent transition metal. For example, M1 and/or M2 may include one or more of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and/or $Yb^{2+}$. For example, in Formula 1, M1 may be $Cu^{2+}$. For example, in Formula 2, M2 may be $Pb^{2+}$.

According to some embodiments, in Formula 3, M3 may be a monovalent metal ion and/or M4 may be a trivalent metal ion. For example M3 may include one or more of $Ag^+$, $Cs^+$, $Rb^+$, $K^+$, and $Na^+$, and/or M4 may include one or more of $Bi^{3+}$, $Sb^{3+}$, and/or $As^{3+}$.

According to some embodiments, in Formulas 1 to 3, X may be a halogen anion. For example, X may include one or more of an iodine ion ($I^-$), a bromide ion ($Br^-$), a chloride ion ($Cr^-$), and/or a fluoride ion ($F^-$). For example, the halogen anion may be one or more of $I^-$, $Br^-$, and/or $Cl^-$.

According to some embodiments, the metal halide compound may be derived from at least one of $Cs_3Cu_2I_5$, $Cs_3Ag_2I_5$, $Cs_3Au_2I_5$, $Cs_4PbBr_6$, $Cs_2AgBiCl_6$, $Cs_2AgBiBr_6$, $(MA)_4PbI_6$, $(MA)_2AgBiBr_6$, $(MA)_2AgBiI_6$, $Cs_2AgSbCl_6$, $(MA)_2AgSbI_6$, and/or $(MA)_2KBiCl_6$ (in these formulas, MA refers to methyl ammonium). In some embodiments, the metal halide compound may be n-doped by forming vacancy in at least one of elements constituting the compound, and/or by doping with a dissimilar element.

According to some embodiments, the metal halide compound, for example, may be a compound represented by $Cs_{3-x}Cu_{2-y}I_{5-z}$ (here, $0 \leq x \leq 0.5$, $0 \leq y \leq 0.5$, and $0 \leq z \leq 0.5$, wherein at least one of x, y, and z may be greater than 0).

The metal halide compound, which has the 0D electronic system (e.g., the compounds represented by Formulas 1 to 3) and/or is n-doped, may have an increase in electrical conductivity via n-doping while having a significantly low thermal conductivity, and thus may exhibit an improved Seebeck coefficient. Accordingly, by including a metal halide compound, such as compounds represented by Formulas 1 to 3, there may be provided a thermoelectric material with improved performance.

According to some embodiments, the metal halide compound may have an electrical thermal conductivity ($\kappa elec$) in the range of about 0.001 W/mK to about 0.03 W/mK. For example, the metal halide compound may have an electric thermal conductivity ($\kappa_{elec}$) in the range of about 0.005 W/mK to about 0.03 W/mK and/or, in some embodiments, the metal halide compound may have an electric thermal conductivity ($\kappa$elec) in the range of about 0.01 W/mK to about 0.03 W/mK. In the above ranges, a thermoelectric material having a high figure of merit (ZT) value may be provided.

According to some embodiments, the metal halide compound may have a ZT value of 2 or greater (e.g., in a doping region) with an electron density of about $2\times10^{19}$ cm$^{-3}$ to about $2\times10^{20}$ cm$^{-3}$. For example, in some embodiments, a region including the n-dopant of a thermoelectric material include the halide compound, the ZT value of 2 or greater and/or the electron density may be about $2\times10^{19}$ cm$^{-3}$ to about $2\times10^{20}$ cm$^{-3}$. Accordingly, the thermoelectric material may have improved thermoelectric performance by including the metal halide compound having a high ZT value as described above.

According to some embodiments, the thermoelectric material may include the metal halide compound in particle form. For example, the thermoelectric material may comprise particles of the metal halide.

According to some embodiments, the thermoelectric material may be included in a thermoelectric element.

The thermoelectric element, depending on the thermoelectric material used, may be a p-type thermoelectric element or an n-type thermoelectric element. Meanwhile, the thermoelectric element may be formed in a predetermined (and/other otherwise desired) shape, for example, a cuboid shape.

The thermoelectric element, for example, may be fabricated by press sintering particles of the thermoelectric material using, e.g., a spark plasma sintering method. Through the above press sintering process, a thermoelectric element in a bulk form may be obtained.

In some embodiments, the thermoelectric element may be formed from the bulk thermoelectric element, by a cutting process and/or the like, into a predetermined (and/or otherwise desired) shape, and then applied to a thermoelectric module.

The thermoelectric element may be combined with an electrode to exhibit cooling effects upon an application of an electric current (e.g., a Thomson effect), and/or to exhibit power generating effects (e.g., a Seebeck effect) from a temperature difference in the element.

According to another embodiment, a thermoelectric module including a first electrode, a second electrode, and the thermoelectric element positioned between the first electrode and the second electrode may be provided.

The thermoelectric module may be configured such that cooling and/or heating effects are exhibited at both ends of the thermoelectric element as an electric current is applied between the first electrode and the second electrode; and/or an electric current may be generated through the thermoelectric element when a temperature difference between the first electrode and the second electrode is present. In the thermoelectric module, a first end portion of the thermoelectric element may contact the first electrode, and a second end portion of the thermoelectric element may contact the second electrode. When the temperature of the first electrode increases compared to the temperature of the second electrode, and/or when the temperature of the second electrode decreases compared to the temperature of the first electrode, an electric current that flows from the first electrode to the thermoelectric element and passes through the thermoelectric element to the second electrode may be generated. While the thermoelectric module is operating, the first electrode and the second electrode may be electrically connected.

Figure 9:
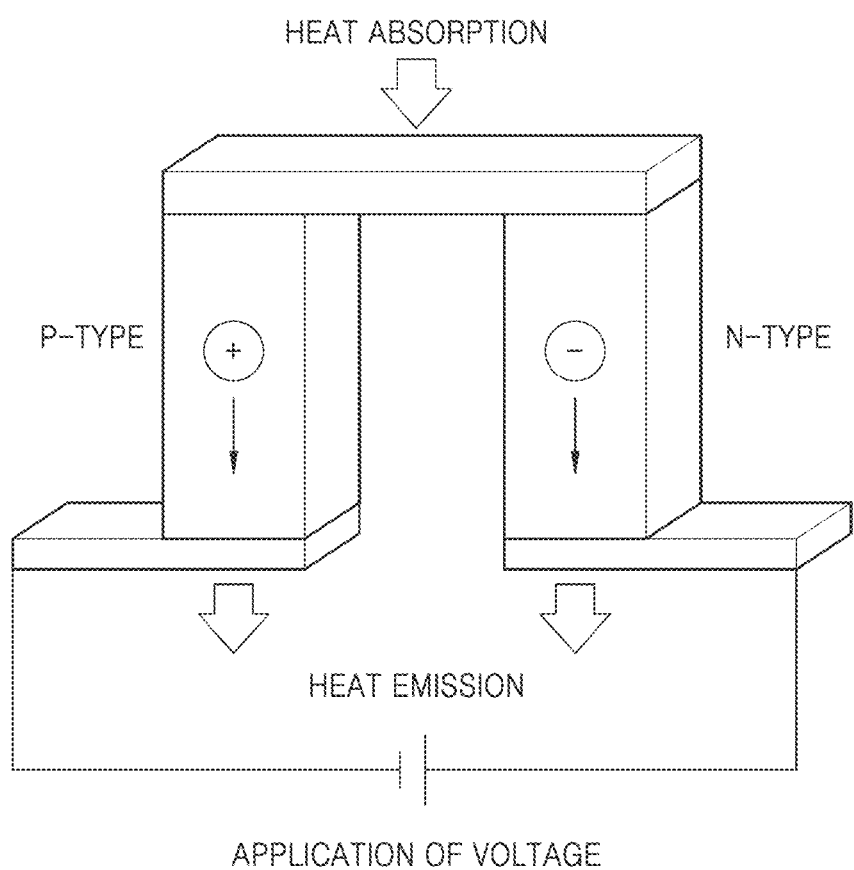
FIG. 9 is a schematic diagram of a thermoelectric module according to some embodiment, exhibiting thermoelectric cooling by the Peltier effect.

In addition, the thermoelectric module may further comprise a third electrode (as illustrated in FIG. 9, and discussed in further detail below) and may further comprise a thermoelectric element positioned between the first electrode and the third electrode.

The thermoelectric module may further include an insulating substrate on which at least one of the first electrode, the second electrode, and optionally, the third electrode, is positioned.

The insulating substrate may include an insulator. The insulator may be, for example, at least one of gallium arsenide (GaAs), sapphire, silicon, Pyrex, a quartz plate, or the like. The electrodes may be and/or include a conductive material, such as a metal, and may be include at least aluminium, nickel, gold, titanium, and/or the like, and may also have any suitable size. The electrode may be patterned using a suitable known patterning method, such as a lift-off semiconductor process, a deposition method, a photolithography method, and/or the like.

Figure 8:
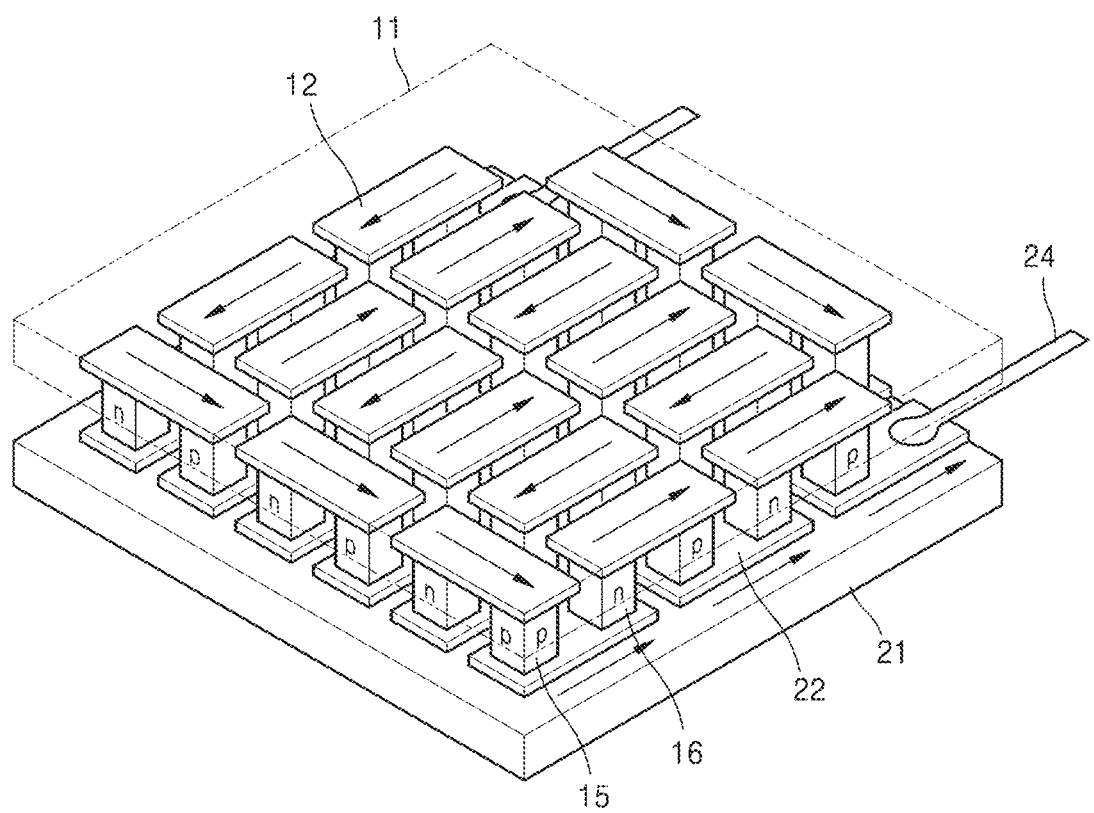
FIG. 8 is a perspective view of a thermoelectric module according to some embodiments.

FIG. 8 shows an example of a thermoelectric module in which the thermoelectric element is employed. As shown in FIG. 8, a top electrode (12) and a bottom electrode (22) are patterned on a top insulating substrate (11) and a bottom insulating substrate (21), respectively. The top electrode (12) and the bottom electrode (22) contact a p-type thermoelectric element (15) and an n-type thermoelectric element (16), respectively. The top electrode (12) and the bottom electrode (22) may be connected to the outside of the thermoelectric element by a lead electrode (24).

In the thermoelectric module, the p-type thermoelectric element and the n-type thermoelectric element may be alternately aligned as shown in FIG. 8, and at least one of the p-type thermoelectric element and the n-type thermoelectric element may include the thermoelectric material.

In the thermoelectric module, one of the first electrode and/or the second electrode may be electrically connected to a power source. In some embodiments, when current is applied to and/or drawn from the thermoelectric module, a temperature difference between the first electrode (e.g., the top electrode 12) and the second electrode (e.g., bottom electrode 22) may be about 1 degree or greater, about 5 degrees or greater, about 50 degrees or greater, about 100 degrees or greater, and/or about 200 degrees or greater. For example, in some embodiments, thermoelectric module may be configured to transport heat, using charge carriers, from one end of the p-type thermoelectric element (15) and/or the n-type thermoelectric element (16) to the other end. A temperature of each of the first electrode and the second electrode may be any temperature as long as the temperature does not cause melting of a constituting element or current interference in the thermoelectric module.

Figure 10:
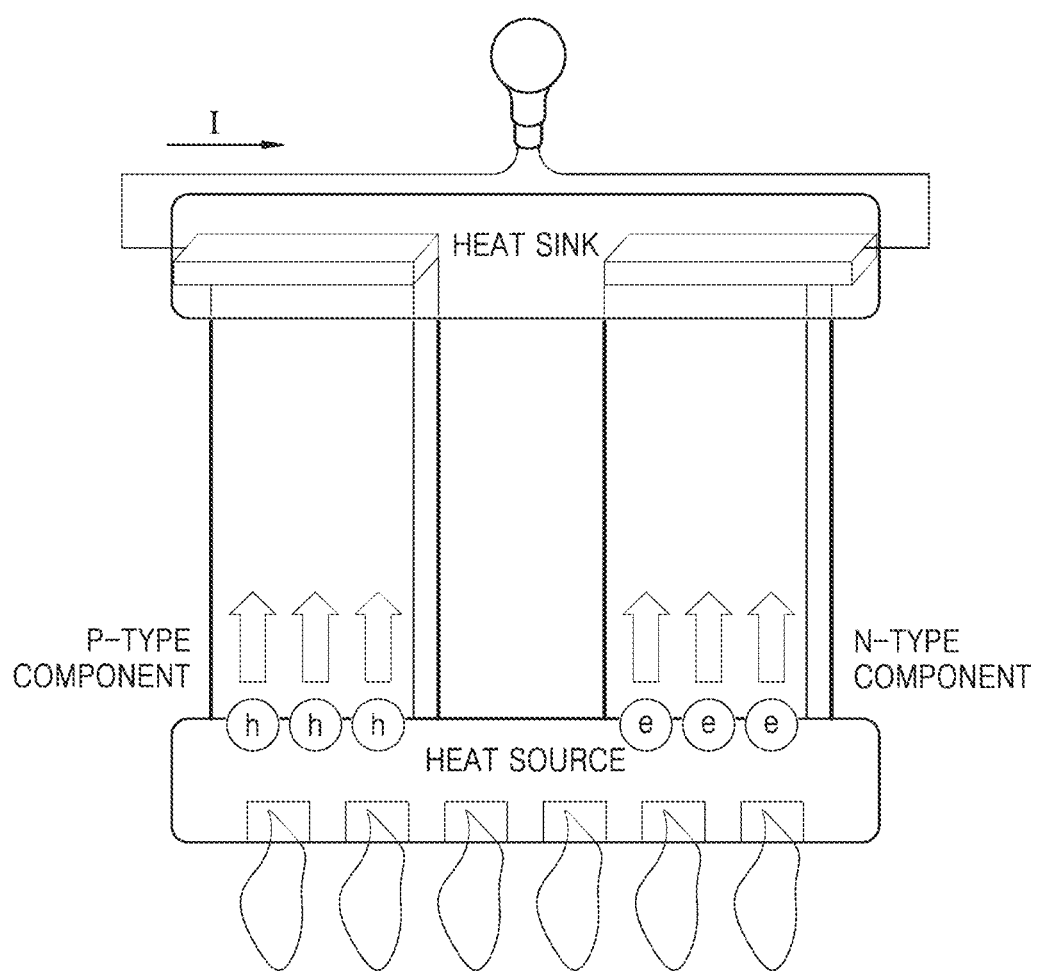
FIG. 10 is a schematic diagram of a thermoelectric module according to some embodiments, exhibiting thermoelectric power generation by the Seebeck effect.

For example, the thermoelectric module may be, as shown in FIG. 9 and/or FIG. 10, and may include a first electrode, a second electrode, and the thermoelectric element described above positioned between the first electrode and the second electrode.

As shown in FIG. 9, in some embodiments of the thermoelectric module, the thermoelectric module may include a first electrode, a second electrode, a third electrode, a p-type thermoelectric element having a first end portion and a second end portion, and an n-type thermoelectric element having a first end portion and a second end portion. The first end portion of the p-type thermoelectric element may contact the first electrode and the second end portion of the p-type thermoelectric element may contact the third electrode. The first end portion of the n-type thermoelectric element may contact the first electrode and the second end portion of the n-type thermoelectric may contact the second electrode. For example, the thermoelectric module may be configured such that when the first electrode has a temperature higher than that of the second electrode and the third electrode, an electric current is generated that flows from the second electrode to the n-type thermoelectric element, passes through the n-type thermoelectric element to the first electrode, flows through the first electrode to a p-type nanostructure, and passes through the p-type nanostructure to the third electrode. While the thermoelectric module is operating, the second electrode and the third electrode may be electrically connected. At least one of the p-type thermoelectric element and/or the n-type thermoelectric element may include a thermoelectric material including a three-dimensional nanostructure. For example, in some embodiments, the n-type thermoelectric element may include the n-doped thermoelectric material of Formulas 1, 2 and/or 3.

The first electrode and the second electrode may be electrically connected to a power source. For example, upon the application of a DC voltage from the outside, holes in the p-type thermoelectric element and electrons in the n-type thermoelectric element migrate, thus causing heat emission and heat absorption at both ends of the thermoelectric element.

As shown in FIG. 10, in an embodiment of the thermoelectric module, at least one of the first electrode and the second electrode may be exposed to a heat source. Upon receiving heat from an external heat source, as electrons and holes migrate, an electric current is created, thus generating electrical energy.

In some embodiments of the thermoelectric module, the p-type thermoelectric element and the n-type thermoelectric element may be alternately aligned as shown in FIGS. 8 to 10, and at least one of the p-type thermoelectric element and the n-type thermoelectric element may include the thermoelectric material. For example, in some embodiments, the n-type thermoelectric element and/or component may include the n-doped thermoelectric material of Formulas 1, 2 and/or 3.

According to some example embodiments, a thermoelectric device including a heat source and the thermoelectric module may be provided, and the thermoelectric module absorbs heat from the heat source and includes the thermoelectric element, a first electrode, and a second electrode, wherein the second electrode is positioned so as to face the first electrode. One of the first and second electrodes may contact the thermoelectric material.

An embodiment of the thermoelectric device may further include a power source electrically connected to the first and second electrodes. An embodiment of the thermoelectric device may further include an electric element electrically connected to one of the first and second electrodes.

The thermoelectric material, the thermoelectric element, the thermoelectric module, and the thermoelectric device may be applied to, for example, a thermoelectric cooling system and/or a thermoelectric power generation system, and the thermoelectric cooling system may include, but is not limited to, a micro cooling system, a general cooler, an air conditioner, a power generation system using waste heat, etc. Additional details of the structure and manufacturing method of the thermoelectric cooling system are known in the art and thus will not be described in further detail herein.

The inventive concepts will be described in greater detail with reference to the following examples and comparative examples. However, the following examples are for illustrative purposes only and are not intended to limit the scope of the inventive concepts and/or present disclosure.

Example 1

In example 1, a thermoelectric material film was prepared by mixing 3 mmol of CsI and 2 mmol of CuI were mixed, as precursors, in a molar ratio of 3:2 in 1 g of dimethyl sulfoxide (DMSO) and stirred at 60° C. for at least 1 hour, to prepare a precursor solution. The precursor solution had a concentration of 0.7 M. Subsequently, a thin film was formed by spin-coating the precursor solution on a UV-ozone treated substrate at 3,000 rpm for 60 seconds. The thin film was annealed at 60° C. for 10 minutes. The thermoelectric material film obtained from the annealing includes a compound of $Cs_{(3-x)}Cu_2I_5$ composition with Cs vacancy.

Example 2

In example 2, a thermoelectric material film was prepared in the same manner as in Example 1, except that in order to n-dope the $Cs_{(3-x)}Cu_2I_5$ material, $MnI_2$ was added such that a molar fraction of $MnI_2$ with respect to CuI reached 0.1.

Example 3

In example 3, a thermoelectric film was prepared in the same manner as in Example 2, except that $MnI_2$ was added such that a molar fraction of $MnI_2$ with respect to CuI reached 0.5.

Example 4

In example 4, a thermoelectric film was prepared in the same manner as in Example 2, except that $MnI_2$ was added such that a molar fraction of $MnI_2$ with respect to CuI reached 0.75.

Example 5

In example 5, a thermoelectric film was prepared in the same manner as in Example 2, except that $MnI_2$ was added such that a molar fraction of $MnI_2$ with respect to CuI reached 1.0.

Example 6

In example 6, a thermoelectric film was prepared in the same manner as in Example 2, except that $MnI_2$ was added such that a molar fraction of $MnI_2$ with respect to CuI reached 1.25.

Example 7

In example 7, a thermoelectric film was prepared in the same manner as in Example 2, except that $MnI_2$ was added such that a molar fraction of $MnI_2$ with respect to CuI reached 1.5.

Example 8

In example 8, a thermoelectric film was prepared in the same manner as in Example 2, except that $MnI_2$ was added such that a molar fraction of $MnI_2$ with respect to CuI reached 2.0.

Example 1 Analysis: Scanning Electron Microscopy (SEM) Analysis

Figure 3:
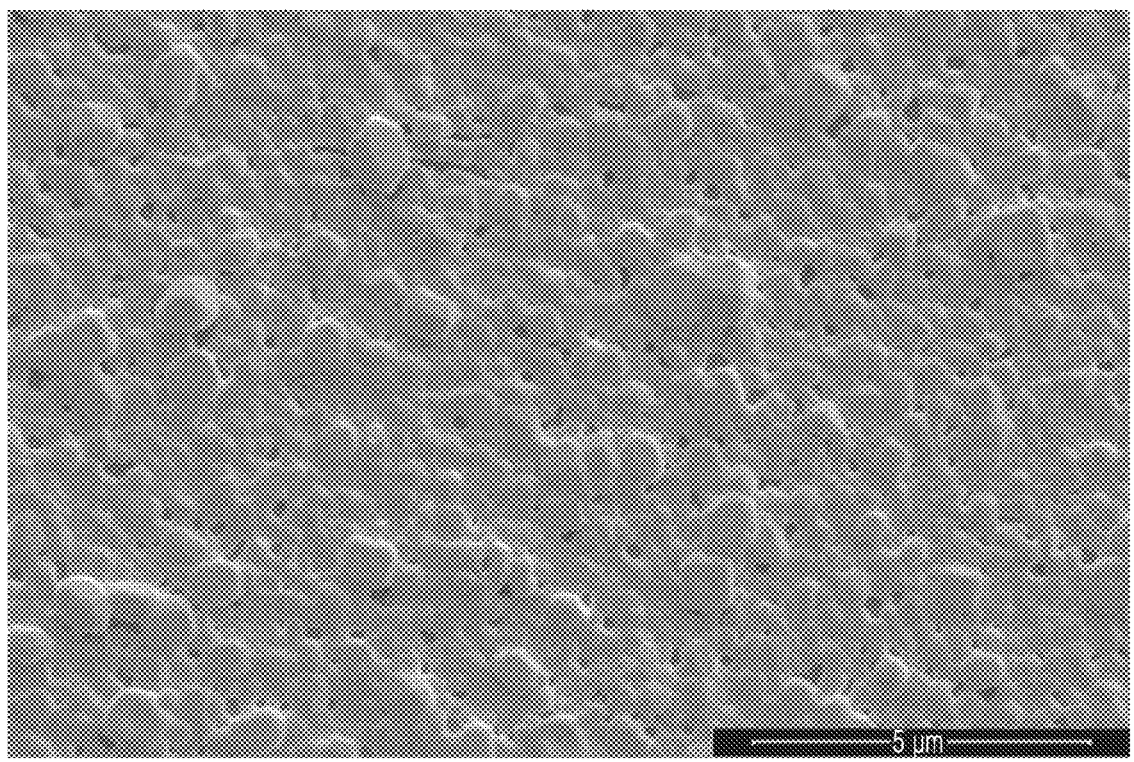
FIG. 3 is a scanning electron microscopic (SEM) image of a thermoelectric material film including a metal halide compound according to Example 1.

The surface of the thermoelectric film prepared in Example 1 was analysed by SEM, and the results are shown in FIG. 3. As show in FIG. 3, the thermoelectric film comprises particles of the thermoelectric material.

Example 1 Analysis: X-Ray Diffraction (XRD) Analysis

Figure 4:
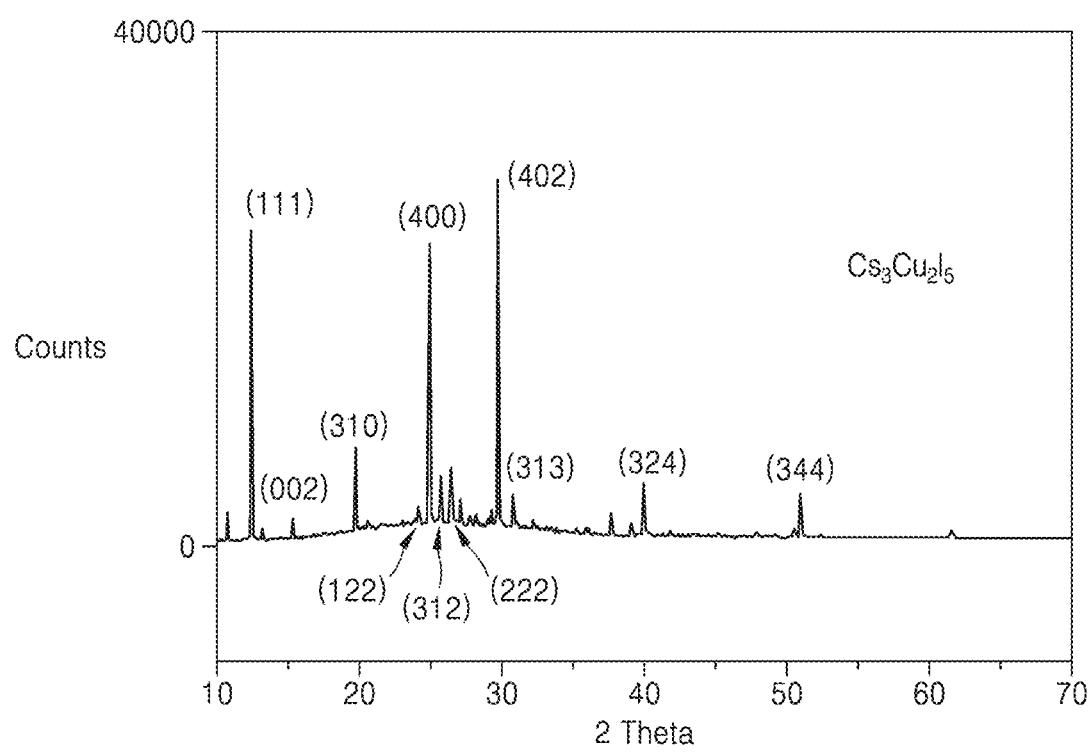
FIG. 4 shows a result of X-ray diffraction analysis of a metal halide compound according to Example 1.

The thermoelectric film prepared in Example 1 was analysed by XRD, and the results are shown in FIG. 4.

As shown in FIG. 4, the thermoelectric film fundamentally has a $Cs_3Cu_2I_5$ crystal structure.

Example 1: Analysis Evaluation of Thermoelectric Performance

As noted above, energy conversion efficiency of a thermoelectric material is represented by a dimensionless figure of merit ZT in Equation 1 below.

$$ZT = \frac{S^2 \sigma T}{\kappa} \qquad <\text{Equation 1}>$$

Equation 1, ZT is a figure of merit, S is a Seebeck coefficient, G is electrical conductivity, T is absolute temperature, and K is thermal conductivity.

To evaluate thermoelectric performance of the thermoelectric element prepared in Example 1, the dimensionless figure of merit (ZT), which includes the Seebeck coefficient (S), the electrical conductivity ($\sigma$), and the thermal conductivity ($\kappa$), was evaluated at room temperature.

Figure 5:
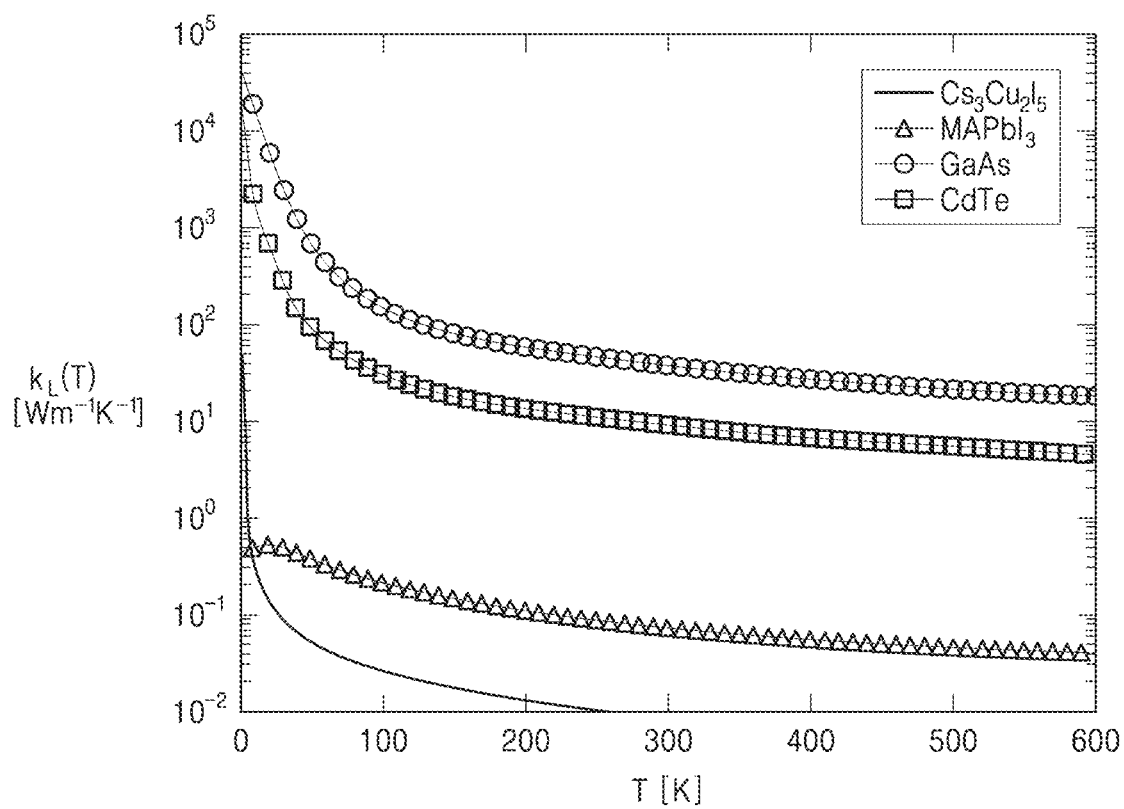
FIG. 5 shows a comparison between a result of measuring lattice thermal conductivity of a metal halide compound according to Example 1 and comparative examples.

The Seebeck coefficient and electrical conductivity were measured by the van der Pauw method using ZEM-3 manufactured by ULVAC-RIKO, the thermal conductivity was measured by measuring thermal diffusivity by the Angstrom method, and the figure of merit was calculated using these measurement values. FIG. 5 shows a comparison between the result of measuring lattice thermal conductivity of the metal halide compound according to Example 1, and a comparative examples $MAPbI_3$, GaAs, and CdTe (data in article [L. D. Whalley, J. M. Skelton, J. M. Frost, and A. Walsh, Phys. Rev. B 94, 220301 (2016)4]).

Referring to FIG. 5, the metal halide compound (e.g., $Cs_3Cu_2I_5$ according to Example 1) has a significantly lower lattice thermal conductivity than that of the comparative examples (e.g., $MAPbI_3$). This indicates that the metal halide compound $Cs_3Cu_2I_5$ according to Example 1 may have disadvantages for applications in LED, but has advantages for applications in other areas such as thermoelectric materials.

Figure 6:
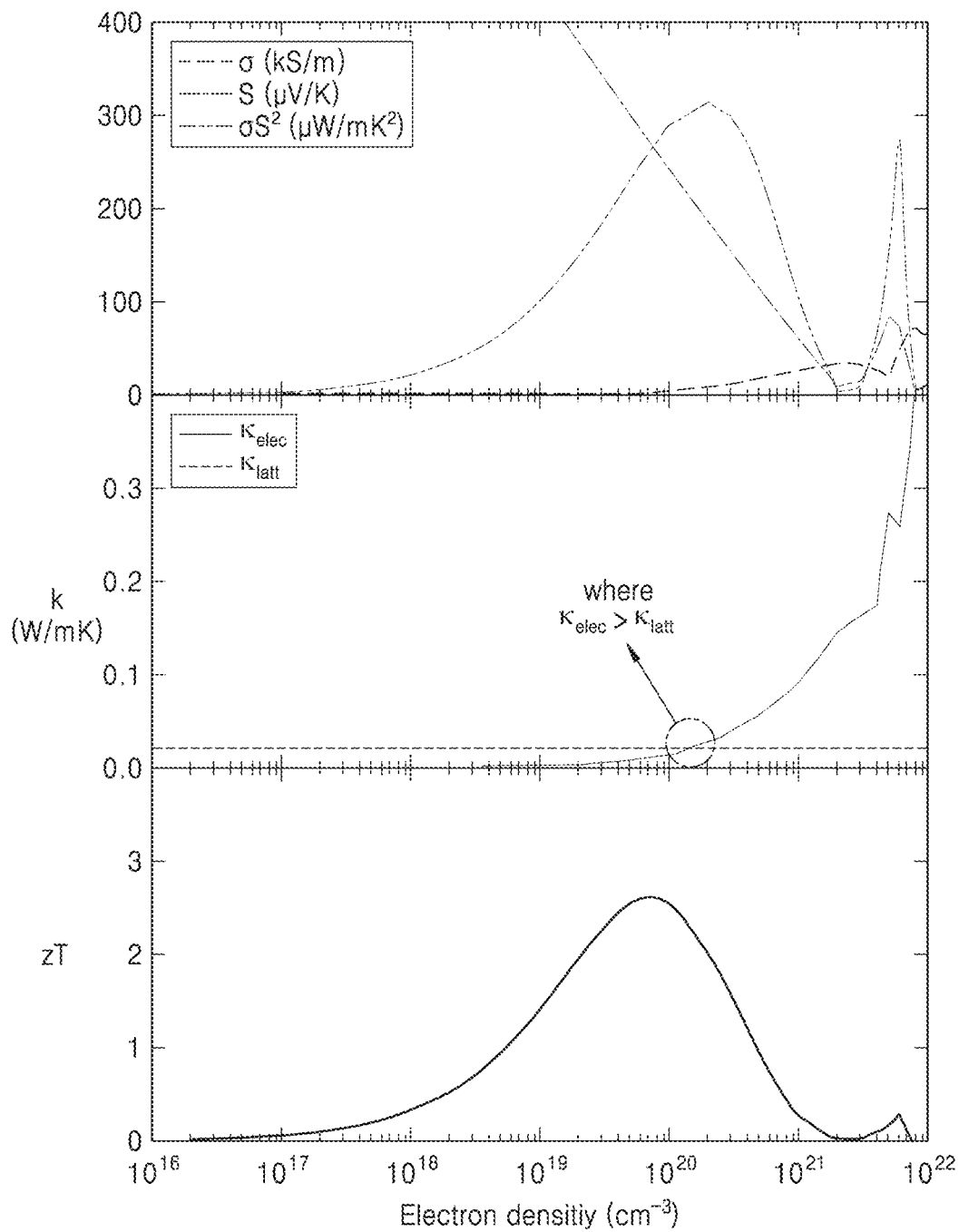
FIG. 6 shows a result of measuring electrical conductivity ($\sigma$), a Seebeck coefficient (S), electrical thermal conductivity ($\kappa elec$), lattice thermal conductivity ($\kappa latt$), and a figure of merit (ZT) of a metal halide compound according to Example 1 prior to n-doping.

FIG. 6 shows results of measuring an electrical conductivity (G), a Seebeck coefficient (S), an electrical thermal conductivity ($\kappa$elec), a lattice thermal conductivity ($\kappa$latt), and a figure of merit (ZT) value of the metal halide compound according to Example 1 prior to n-doping.

Referring to FIG. 6, the metal halide compound $Cs_3Cu_2I_5$ (e.g., according to Example 1), due to low electrical thermal conductivity ($\kappa$elec), exhibited an extremely high figure of merit (ZT) value (>2) in a doping region of $10^{19}$-$10^{21}$ $cm^{-3}$. For reference, the thermal conductivity of air at room temperature is about 0.026 W/mK. It was found that the metal halide compound $Cs_3Cu_2I_5$ according to Example 1 has an inherent carrier density of about $10^4$ $cm^{-3}$ and is p-type, and accordingly, it could be seen that the metal halide compound $Cs_3Cu_2I_5$ according to Example 1 may be applied to a thermoelectric material via n-doping. Further, as shown in FIG. 6, around an electron density of up to $10^{20}$/$cm^3$, the thermal conductivity attributed to electrons becomes equal to the thermal conductivity due to lattice vibrations, and at this point, a maximum ZT value is obtained, and at doping levels thereabove, the ZT value decreases again due to increasing thermal conductivity attributed to electrons.

Table 1 shows a result of measuring a Seebeck coefficient (S), an electrical conductivity ($\sigma$), a thermal conductivity ($\kappa$) of the thermoelectric element prepared in Example 1, and a figure of merit (ZT) value calculated therefrom.

TABLE 1

|  | Example 1 | Comparative Example 1 ($MAPbI_3$) | Comparative Example (GaAs) |
|---|---|---|---|
| ZT | 2.3 (doped up to $10^{19}$/$cm^3$ electron density) | — | — |
| Electrical conductivity@300 K (S/cm) | $2 \times 10^{-8}$ (undoped) 0.5 (doped up to $10^{19}$/$cm^3$ electron density) | $3 \times 10^{-5}$ | 0.3 |
| Thermal conductivity@300 K (W/m-K) | 0.007 (undoped) 0.01 (doped up to $10^{19}$/$cm^3$ electron density) | 0.8 | 86 |
| Seebeck coefficient ($\mu$v/K) | 1,100-1,300 (undoped) 300 (doped up to $10^{19}$/$cm^3$ electron density) | 800 | 250 |

As shown in Table 1, the thermoelectric material of Example 1 has a high Seebeck coefficient and a low thermal conductivity. Further, it could be seen that a high ZT value of 2 or greater is expected when the density of free electrons is optimized via n-doping at the level of $10^{19}$-$10^{20}$/$cm^3$.

Figure 7:
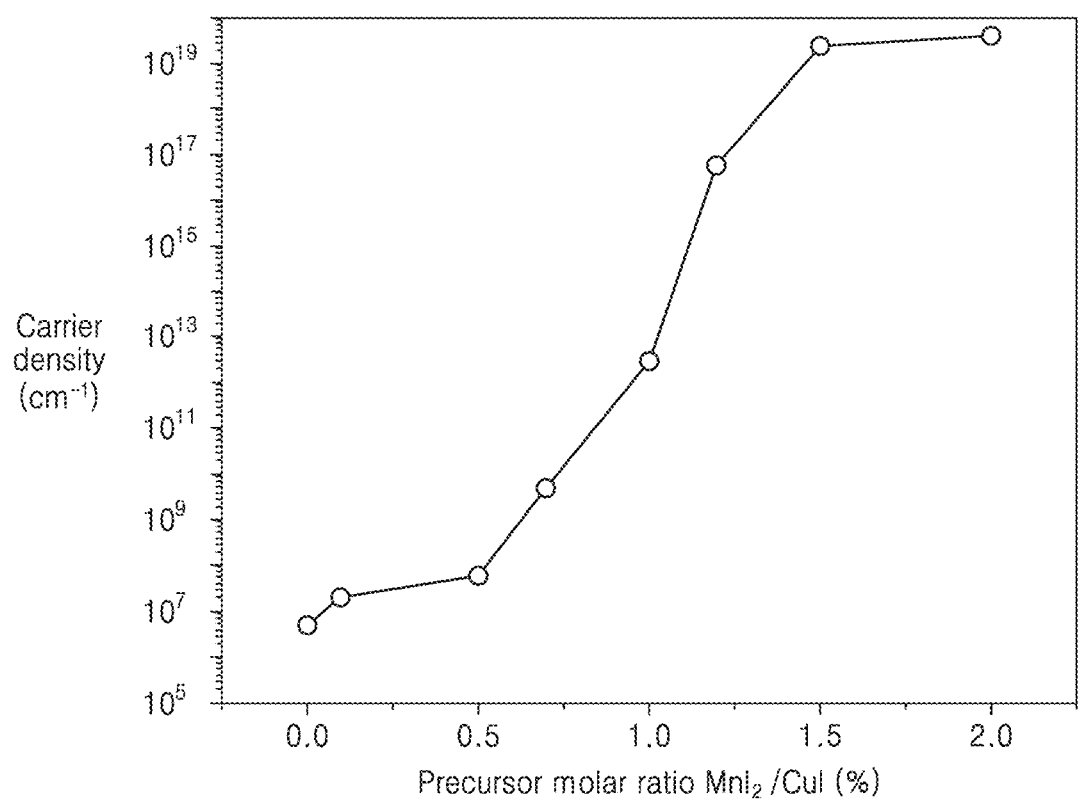
FIG. 7 is a graph showing carrier density of a thermoelectric material according to Examples 1 to 8.

Meanwhile, to determine the effect of n-doping on the $Cs_3Cu_2I_5$ material, the thermoelectric materials prepared in Examples 1 to 8 (e.g., by varying a molar ratio of a precursor compound for n-doping) were measured for carrier density, and the results are shown in FIG. 7.

As shown in FIG. 7, it could be seen that the $Cs_3Cu_2I_5$ material may be n-doped using a precursor material (for example, $MnI_2$) containing 1-2 atomic % (relative to Cu) of a dissimilar metal ion such as Mn and Eu. Further, it was found that the electron carrier density increases in proportion to the percentage of $MnI_2$ precursor.

As described above, according to some example embodiments, the thermoelectric material has a significantly low thermal conductivity and improved electrical conductivity and thus can enhance thermoelectric performance. In the foregoing, example embodiments of the present inventive concepts have been described with reference to drawings and examples, but these are to be regarded in an illustrative sense only and accordingly, many modifications and variations of the present inventive concept are possible in light of the foregoing specification and could be apparent for those skilled in the art. Accordingly, the scope of the present inventive concepts is defined by the appended claims.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A thermoelectric element comprising:
a thermoelectric material comprising an n-doped metal halide compound,
wherein the metal halide compound includes a zero-dimensional (0D) electronic system, and
wherein the metal halide compound comprises one or more of compounds represented by Formulas 1:

$$A_{3-x}M1_{2-y}X_{5-z} \qquad <\text{Formula 1}>$$

wherein, A is a monovalent cation and at least one of an alkali metal cation, a free ammonium ion, an amidinium-group ion, or a combination of a free ammonium ion and an amidinium-group ion, M1 is a divalent transition metal, X is a halogen, $0 \le x \le 0.5$, $0 \le y \le 0.5$, and $0 \le z \le 0.5$, and at least one of x, y, and z is greater than 0.

2. The thermoelectric material of claim 1, wherein in the alkali metal cation comprises one or more selected from $Cs^+$, $Rb^+$, $K^+$, and $Na^+$, the free ammonium ion comprises a structure represented by at least one of Formulas 4 and 5, and the amidinium-group ion comprises a structure represented by Formula 6:

$$R_1\text{—}NH_3^+ \qquad <\text{Formula 4}>$$

wherein $R_1$ is a C1-C24 alkyl group, a C3-C20 cycloalkyl group, or a C6-C20 aryl group;

$$R_2\text{—}C_3H_3N_2^+\text{—}R_3 \qquad <\text{Formula 5}>$$

wherein $R_2$ is a C1-C24 alkyl group, a C3-C20 cycloalkyl group, or a C6-C20 aryl group, and $R_3$ is a hydrogen atom or a C1-C24 alkyl group; and <Formula 6>

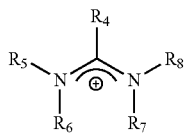

wherein $R_4$ to $R_8$ are each independently a hydrogen atom, a C1-C24 alkyl group, a C3-C20 cycloalkyl group, or a C6-C20 aryl group.

3. The thermoelectric material of claim 1, wherein M1 comprises one or more of $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, or $Yb^{2+}$.

4. The thermoelectric material of claim 1, wherein X comprises one or more of an iodide ion ($I^-$), a bromide ion ($Br^-$), a chloride ion ($Cl^-$), or a fluoride ion ($F^-$).

5. The thermoelectric material of claim 1, wherein
the metal halide compound is derived from at least one of $Cs_3Cu_2I_5$, $Cs_3Ag_2I_5$, $Cs_3Au_2I_5$, $Cs_2AgBiCl_6$, $Cs_2AgBiBr_6$, $(MA)_2AgBiBr_6$, $(MA)_2AgBiI_6$, $Cs_2AgSbCl_6$, $(MA)_2AgSbI_6$, or $(MA)_2KBiCl_6$,
MA refers to a methylammonium ion, and
the metal halide compound is n-doped by vacancies replacing at least one of elements constituting the metal halide compound, or by an element dissimilar to the elements constituting the metal halide compound.

6. The thermoelectric material of claim 1, wherein
the metal halide compound comprises a compound represented by $Cs_{3-x}Cu_{2-y}I_{5-z}$,
wherein, $0 \le x \le 0.5$, $0 \le y \le 0.5$, and $0 \le z \le 0.5$, and at least one of x, y, and z is greater than 0.

7. The thermoelectric material of claim 1, wherein the metal halide compound has an electrical thermal conductivity ($\kappa_{elec}$) in a range of about 0.001 W/mK to about 0.03 W/mK.

8. The thermoelectric material of claim 1, wherein the metal halide compound has a figure of merit (ZT) value of 2 or greater in a doping region having an electron density of about $2 \times 10^{19}$ cm$^{-3}$ to about $2 \times 10^{20}$ cm$^{-3}$.

9. The thermoelectric material of claim 1, wherein the metal halide compound is included in a particle form.

10. A thermoelectric module comprising:
a first electrode;
a second electrode; and
the thermoelectric element according to claim 1 between the first electrode and the second electrode.

* * * * *